(12) United States Patent
Pfortner et al.

(10) Patent No.: US 9,482,716 B2
(45) Date of Patent: Nov. 1, 2016

(54) BASE ELEMENT FOR ACCOMMODATING AN OVERVOLTAGE PROTECTION MODULE, AND MODULAR BUS SYSTEM

(75) Inventors: Steffen Pfortner, Springe (DE); Andrei Siegel, Paderborn (DE); Thomas Meyer, Ottenstein (DE)

(73) Assignee: Phoenix Contact GmbH & Co. KG, Blomberg (DE)

( * ) Notice: Subject to any disclaimer, the term of this patent is extended or adjusted under 35 U.S.C. 154(b) by 446 days.

(21) Appl. No.: 14/239,536

(22) PCT Filed: Aug. 17, 2012

(86) PCT No.: PCT/EP2012/066079
§ 371 (c)(1),
(2), (4) Date: May 15, 2014

(87) PCT Pub. No.: WO2013/024151
PCT Pub. Date: Feb. 21, 2013

(65) Prior Publication Data
US 2014/0253164 A1   Sep. 11, 2014

(30) Foreign Application Priority Data

Aug. 18, 2011  (DE) .................. 10 2011 052 803
Mar. 8, 2012  (DE) .................... 20 2012 002 282 U

(51) Int. Cl.
*G08B 21/00* (2006.01)
*G01R 31/28* (2006.01)
(Continued)

(52) U.S. Cl.
CPC ....... *G01R 31/2827* (2013.01); *G05B 19/0428* (2013.01); *G05B 19/058* (2013.01);
(Continued)

(58) Field of Classification Search
CPC ..... G01F 23/247; G08B 21/182; G08B 3/10; G08B 25/14; H03K 17/0822; H02H 3/207
USPC ........ 340/500, 540, 657, 660, 662; 361/103, 361/91.1, 91.2, 86, 14, 760, 90, 1, 88; 439/607.01, 620.08, 620.21
See application file for complete search history.

(56) References Cited

U.S. PATENT DOCUMENTS 4,484,185 A * 11/1984 Graves ................ H01R 31/065
174/66
6,000,825 A   12/1999 Fredriksson
(Continued)

FOREIGN PATENT DOCUMENTS

DE   20 2006 006 659 U1   8/2006
DE   10 2006 038 005 A1   11/2007
(Continued)

OTHER PUBLICATIONS

International Search Report for PCT/EP2012/066079 dated Nov. 9, 2012, 2 pgs.
(Continued)

*Primary Examiner* — Hoi Lau
(74) *Attorney, Agent, or Firm* — Knobbe, Martens, Olson & Bear LLP

(57) ABSTRACT

The invention relates to a base element (ST1, ST2, ST3) for receiving an overvoltage protective module (M1, M2, M3) for use in a bus system, having a first bus connection arrangement (BK1) for contacting a first bus potential (L1), a second bus connection arrangement (BK2) for contacting a second bus potential (L2), a third bus connection arrangement (BK3) for contacting a signal bus (L3), wherein the signal bus in a first state indicates the occurrence of a fault and in a second state indicates the non-occurrence of a fault, wherein a fault indicates a missing or incorrectly received or faulty overvoltage protective module (M1, M2, M3), wherein the first and second bus potential are to be used to supply arrangements on the overvoltage protective module (M1, M2, M3), wherein the base element further comprises an electronic monitoring arrangement (UE1), wherein the electronic monitoring arrangement (UE1) identifies whether an overvoltage protective module (M1, M2, M3) is received, wherein, if an overvoltage protective module (M1, M2, M3) is received in the base element (ST1, ST2, ST3), the second state is signalled via the signal bus, and, if no overvoltage protective module (M1, M2, M3) is received in the base element (ST1, ST2, ST3) or if the overvoltage protective module (M1, M2, M3) is received incorrectly or if the overvoltage protective module (M1, M2, M3) is faulty, the state of the signal bus remains unchanged, wherein the base elements (ST1, ST2, ST3) can be clipped onto a mounting rail (TS1, TS2), and the first bus potential (L1), the second bus potential (L2) and the signal bus (L3) are guided in a recess in the mounting rail (TS1, TS2).

20 Claims, 8 Drawing Sheets

(51) Int. Cl.
  *H01T 1/12* (2006.01)
  *H01T 4/06* (2006.01)
  *G05B 19/042* (2006.01)
  *G05B 19/05* (2006.01)
  *H02H 1/00* (2006.01)

(52) U.S. Cl.
  CPC ............... *H01T 1/12* (2013.01); *H01T 4/06* (2013.01); *G05B 2219/21155* (2013.01); *G05B 2219/24029* (2013.01); *G05B 2219/24132* (2013.01); *H02H 1/0061* (2013.01); *Y02B 70/3241* (2013.01); *Y04S 20/227* (2013.01)

(56) References Cited

U.S. PATENT DOCUMENTS

| | | | | |
|---|---|---|---|---|
| 6,217,389 | B1* | 4/2001 | Jatou | H01R 13/6666 439/620.29 |
| 8,072,728 | B2 | 12/2011 | Willmann et al. | |
| 8,982,578 | B2* | 3/2015 | Bryan | B60Q 11/005 361/760 |
| 2004/0042141 | A1* | 3/2004 | Mikolajczak | H05K 1/0233 361/103 |
| 2005/0146826 | A1* | 7/2005 | Huang | H01H 37/761 361/104 |
| 2005/0195547 | A1* | 9/2005 | Huang | H01R 13/696 361/103 |
| 2005/0231872 | A1* | 10/2005 | Schimanski | H01T 4/06 361/91.1 |
| 2007/0077816 | A1* | 4/2007 | Wan | H01R 13/6666 439/607.01 |
| 2008/0096429 | A1* | 4/2008 | Mikolajczak | H01R 13/68 439/620.08 |
| 2011/0026184 | A1* | 2/2011 | Tegt | H01T 4/02 361/118 |
| 2011/0032651 | A1* | 2/2011 | Depping | H01H 37/761 361/91.1 |
| 2011/0053420 | A1* | 3/2011 | Shirai | H01R 13/6666 439/620.21 |
| 2011/0267730 | A1* | 11/2011 | Brand | H02H 9/04 361/91.2 |
| 2012/0094509 | A1* | 4/2012 | Bryan | B60Q 11/005 439/76.1 |
| 2012/0170165 | A1* | 7/2012 | Jung | H02H 1/06 361/86 |
| 2014/0253164 | A1* | 9/2014 | Pfortner | H01T 1/12 324/756.01 |
| 2014/0327990 | A1* | 11/2014 | Juricev | H01C 7/126 361/14 |

FOREIGN PATENT DOCUMENTS

| | | |
|---|---|---|
| DE | 10 2006 030 570 A1 | 1/2008 |
| DE | 10 2008 063 816 A1 | 6/2010 |
| DE | 10 2009 015 068 A1 | 10/2010 |

OTHER PUBLICATIONS

International Written Opinion for PCT/EP2012/066079 dated Feb. 18, 2014, 6 pgs.
International Preliminary Report on Patentability for CPT/EP2012/066079 dated Feb. 18, 2014, 6pgs.
German Office Action for DE 10 2011 052 803.2 dated Jul. 9, 2012, 5 pgs.

* cited by examiner

BASE ELEMENT FOR ACCOMMODATING AN OVERVOLTAGE PROTECTION MODULE, AND MODULAR BUS SYSTEM

CROSS REFERENCE TO RELATED APPLICATIONS

This application is a U.S. National Stage Application of International Application No. PCT/EP2012/066079 filed Aug. 17, 2012, published as WO2013/024151A1, which claims priority from German Patent Application Nos. 102011052803.9, filed Aug. 18, 2011 and 202012002282.2, filed Mar. 8, 2012, which are incorporated herein by reference in entirety.

BACKGROUND

The invention relates to a base element for receiving an overvoltage protective module and also to a modular bus system comprising one or more base elements of the aforementioned type.

A large number of overvoltage protective devices are nowadays installed in many fields. Here, with increasing complexity of systems and devices, the risk also increases that an incorrectly installed overvoltage protected device may lead to a failure of a device or even to the standstill of an entire system, since the overvoltage protection is not ensured.

In order to minimise complexity and in order to increase the ease of maintenance of overvoltage protective devices, pluggable overvoltage protective modules have been developed.

However, there is then the problem of identifying whether an overvoltage protective module has been inserted correctly into a corresponding mount, in other words whether the overvoltage protective module can also perform its function.

In other technical fields, for example in the field of power supply, systems have been proposed in which a mechanical push-button, which is installed in a base element, is used in order to provide an indication of the plugged state. Such a system is embodied for example in products from the VAL-MS or VAL-CP product range created by the applicant.

With increasing miniaturisation, this principle is limited however, since the size of the components cannot be reduced arbitrarily. On the other hand, with smaller models increased requirements are placed on the manufacturing tolerances. The sensitivity with respect to dirt deposits and other mechanical influences, such as vibrations or impact stresses, additionally increases sharply. Furthermore, with frequent actuation of the switch, that is to say with frequent change of the pluggable modules, wear may also take effect, which minimises the switching reliability. In this regard, such devices can only be produced in small sizes with increased design effort and cost.

The object of the invention is to provide a modular system for overvoltage protective devices which allows reliable identification, even with the smallest models, and/or which can additionally be produced cost-effectively and/or furthermore also minimises the wiring complexity, and additionally to increase reliability.

The object is solved in accordance with the invention by the features of the independent claim. Advantageous embodiments of the invention are specified in the dependent claims and in the description.

DESCRIPTION OF THE DRAWINGS

The invention will be explained in greater detail hereinafter with reference to the accompanying drawing on the basis of preferred embodiments.

In the drawing.

DETAILED DESCRIPTION OF ILLUSTRATIVE IMPLEMENTATIONS

Figure 1:
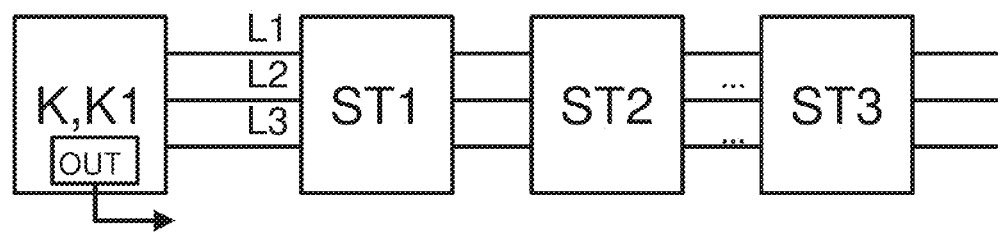
FIG. 1 shows a schematic illustration of a modular bus system in accordance with a preferred embodiment of the invention.

FIG. 1 shows a schematic illustration of a modular bus system in accordance with a preferred embodiment of the invention. The bus system has a head module K1 and one or more base elements ST1, ST2, ST3. The head module K1 and the base element or the base elements ST1, ST2, ST3 are connected via a bus system which, in the illustrated example, has at least 3 logical lines.

Figure 6:
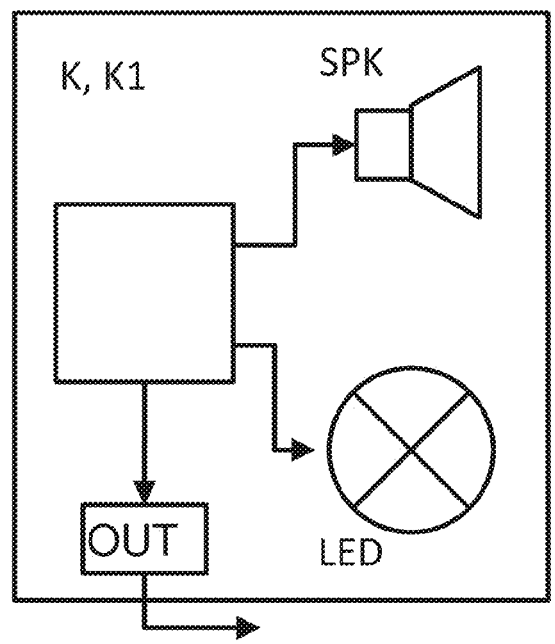
FIG. 6 shows a schematic illustration of elements of a head module in accordance with a preferred embodiment of the invention.

Each of the base elements ST1, ST2, ST3 is suitable for receiving an overvoltage protective module M1, M2, M3. The head module K1 has a first bus connection arrangement for contacting a first bus potential L1, a second bus connection arrangement for contacting a second bus potential L2, and a third bus connection arrangement for contacting a signal bus connection L3, wherein the signal bus in a first state indicates the occurrence of a fault and in a second state indicates the non-occurrence of a fault. Furthermore, the head module K1, as shown in FIG. 6, has at least one signalling arrangement, which indicates whether one or more faults has/have been signalled on the signal bus L3. A suitable signalling arrangement may be, for example, an illuminated display LED, a display, or a sound generator SPK or the like. Alternatively or additionally, the head module K1 may also have a remote notification arrangement OUT, which can pass on notification of an identified fault. Such a remote notification arrangement may be, for example, a fieldbus system or another suitable interface, such as USB, Ethernet, etc., and the head module is accordingly designed to provide messages concerning the state, said messages being adapted for the respective interface. Furthermore, the head module K1 may also contain an electronic processing arrangement for evaluating, for example, 30 or more pieces of data of the overvoltage protective modules or to create messages to be sent via the remote notification arrangement OUT or to be displayed in a display. For this purpose, a microcontroller or a microprocessor may be provided, for example.

Although other connection techniques and signalling methods would be possible with the presented invention, for example the use of other data bus systems, for example a 1-wire bus, a particularly favourable variant is described hereinafter. In this variant, physical properties are assigned to the three logical lines of the bus system. For example, a first and a second bus potential are thus provided by the head module K via the first and second bus connection arrangement in order to supply the base elements ST1, ST2, ST3 and overvoltage protective modules M1, M2, M3 associated therewith and the devices or systems associated with these overvoltage protective modules. The third line, that is to say the signal bus L3, is used for signalling, for example for the signalling of faults of the overvoltage protective modules or incorrectly inserted overvoltage protective modules. For example, the first bus potential is assigned 0 V or −12 V or a low level, and the second bus potential is assigned 3.3 V or 5 V or 12 V or a high level.

Figure 2:
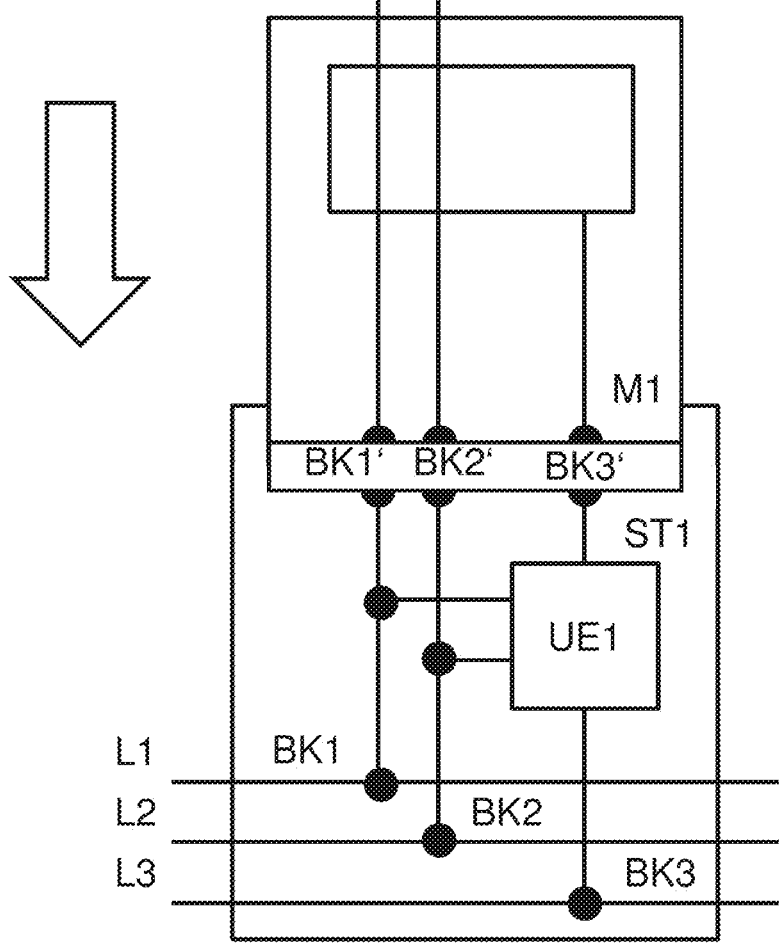
FIG. 2 shows a schematic illustration of a base element with an overvoltage protective module, which is to be plugged in, in accordance with a preferred embodiment of the invention.

FIG. 2 shows a schematic illustration of a base element ST1 with an overvoltage protective module M1, which is to be plugged in, in accordance with a preferred embodiment of the invention. Here, the insertion direction is indicated by the arrow. The base element ST1, ST2, ST3 for this purpose has mechanical provisions, thus enabling reliable insertion and reliable holding of the overvoltage protective module M1, M2, M3 and enabling contact by means of the bus connection arrangements BK1', BK2', BK3'. This base element has a first bus connection arrangement BK1 for contacting the first bus potential L1, a second bus connection arrangement BK2 for contacting the second bus potential L2, and a third bus connection arrangement BK3 for contacting the signal bus L3. The signal bus shows in a first state the occurrence of a fault and in a second state the non-occurrence of a fault, wherein a fault informs the head module K or the head modules K, K1 and other arrangements connected to the bus of a missing or incorrectly received overvoltage protective module. Here, the first and second bus potential are used to supply arrangements on the overvoltage protective module M1. The base element furthermore has an electronic monitoring arrangement UE1, wherein the electronic monitoring arrangement UE1 identifies whether an overvoltage protective module M1 is received. If an overvoltage protective module M1 is received in the base element ST1, the second state is signalled via the signal bus, and, if no overvoltage protective module M1 is received in the base element ST1 or if the overvoltage protective module M1 is incorrectly received, the state of the signal bus remains unchanged.

In contrast to the prior art, an electronic monitoring arrangement allows much smaller models. In addition, electronic monitoring arrangements can be produced cost-effectively and, in contrast to mechanical switches, are less susceptible to faults.

In an advantageous development of the invention, the electronic monitoring arrangement UE1 has a semiconductor switch. Semiconductor switches can be produced and integrated in a particularly cost-effective manner.

In a further, advantageous development of the invention, the electronic monitoring arrangement is connected as an opener, wherein, in the case of a correctly received overvoltage protective module M1, the "switch" is opened.

Figure 3:
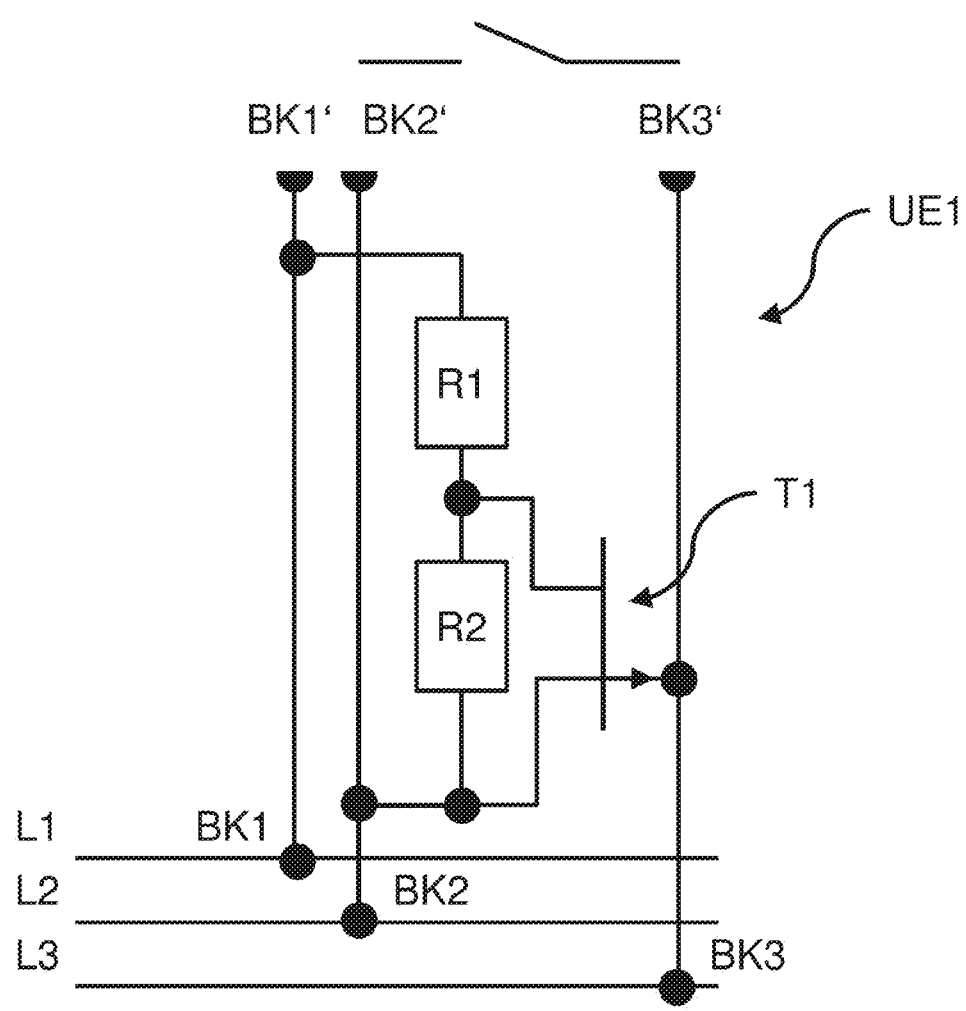
FIG. 3 shows a schematic illustration of a first embodiment of a monitoring arrangement in a base element in accordance with a preferred embodiment of the invention.
Figure 4:
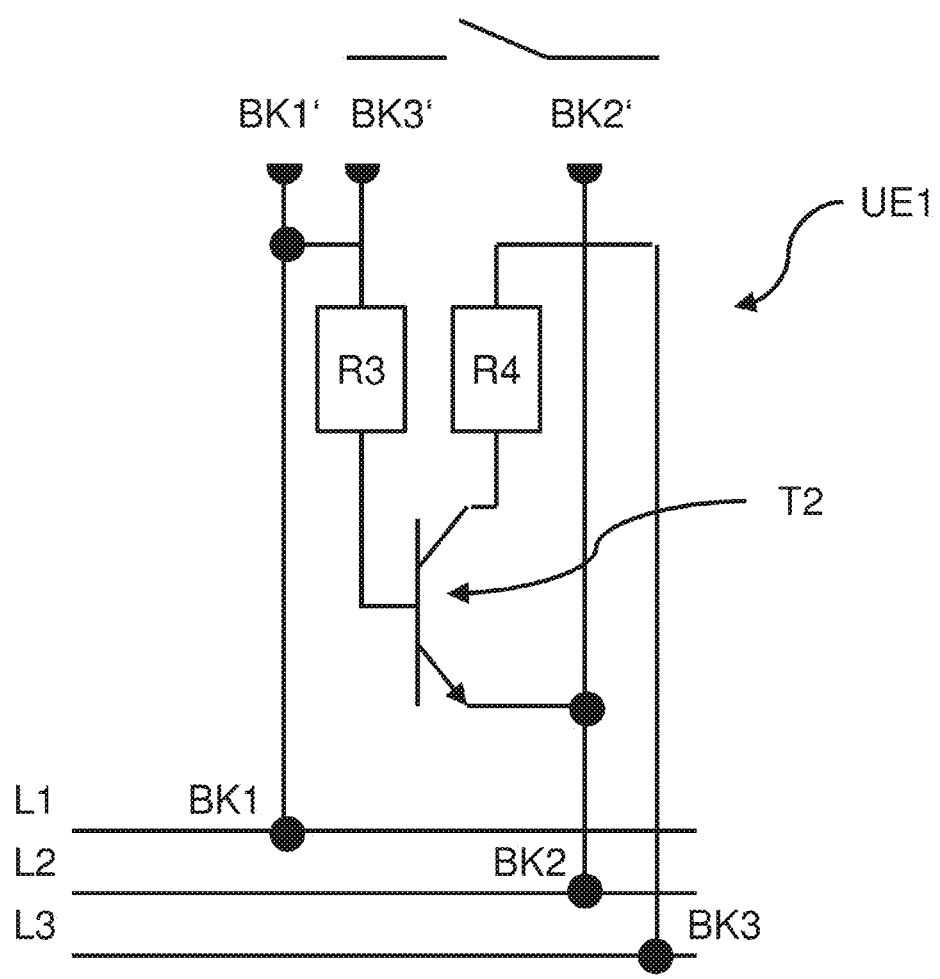
FIG. 4 shows a schematic illustration of a second embodiment of a monitoring arrangement in a base element in accordance with a preferred embodiment of the invention.

In a further, advantageous development of the invention, the electronic monitoring arrangement UE1 has a transistor T1, T2. Such embodiments and schematic wiring schemes are illustrated in FIGS. 3 and 4. Here, a base element ST1 which is connected by means of the bus connection arrangements BK1, BK2 to the first and second bus potential L1, L2 is shown in FIG. 3. These bus potentials are guided to terminals BK1', BK2' for connection to an overvoltage protective module M1. The base element ST1 is furthermore connected to the signal bus L3 by means of the bus connection arrangement BK3, which is likewise guided to a terminal BK3' for connection to the overvoltage protective module M1. A suitably dimensioned voltage divider is formed between the bus potentials and is assembled from the resistors R1 and R2. In the illustrated example the first bus potential is 0 V whereas the second bus potential is 5 V. The voltage divider would then be connected for example to the drain terminal of a p-channel (J) FET, whereas the source terminal would be connected to the first bus potential. If no overvoltage protective module M1 is introduced, that is to say if the contacts BK1', BK2' and BK3' are not contacted, the transistor T1 is thus conductive. If an overvoltage protective module M1 is introduced, this overvoltage protective module M1 thus signals that it is functioning correctly by providing a voltage or a current across the signal bus L3 via the contact BK3', for example by producing a conductive connection, presented as a closer over the contacts BK1' and BK3'.

The embodiment according to FIG. 4 differs only insignificantly from the embodiment in FIG. 3. Now, instead of an FET transistor, a bipolar transistor is used. Again, it is assumed that a potential of 0 V is provided across line L1 and that a potential of 5 V is provided across line L2. A resistor R3 is connected to the base of the npn transistor T2. The emitter is connected to the second bus potential. The collector is in turn connected to the signal bus L3. In contrast to FIG. 3, the signal bus L3 is not fed through to the terminal BK3' via BK3. If an overvoltage protective module M1 is introduced, this overvoltage protective module M1 thus signals that it is functioning correctly by providing a voltage or a current across the signal bus L3 via the contact BK3', for example by producing a conductive connection, presented as a closer over the contacts BK2' and BK3'.

Of course, other semiconductor elements and circuits can also be used. An essential feature of the circuits for UE1 is that a faulty overvoltage protection of an individual module leads to a fault message in the head module.

Figure 5:
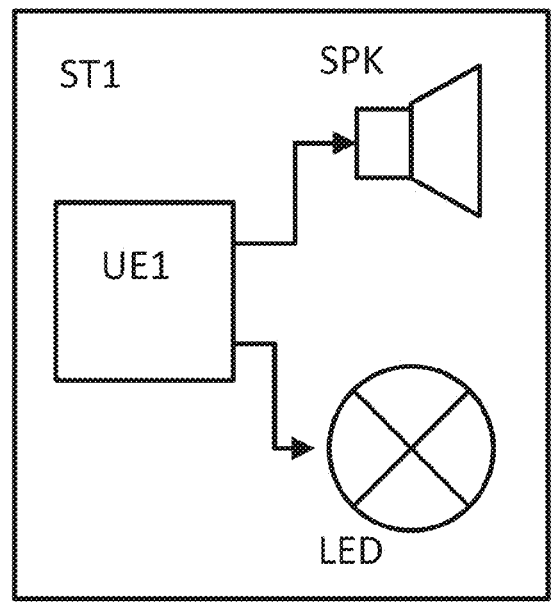
FIG. 5 shows a schematic illustration of elements of a base element in accordance with a preferred embodiment of the invention.

Furthermore, in advantageous developments of the invention, as shown in FIG. 5, the base element ST1, ST2, ST3 has a local signalling arrangement for signalling to the optical display LED and/or to the acoustic display SPK in order to indicate whether an overvoltage protective module M1, M2, M3 is received. Here, a mechanical display, which for example provides a colour change, may also be provided alternatively or additionally in order to indicate whether the base element ST1 contains a correctly received overvoltage protective module.

Due to the previously described embodiment with an opener function, the faulty receipt of an individual overvoltage protective module is not disturbed over the signal bus by further correctly received overvoltage protective modules. An OR function is thus produced in the logic sense and the head station communicates the fault of one or more overvoltage protective modules over the bus monitored thereby.

If all overvoltage protective modules are located in the respective mounts, the signal bus can also be used for further signalling processes. For example, it is thus possible to call up data from individual overvoltage protective modules M1, M2, M3 and to use the signal bus L3 for data transmission from and to the head module K, K1. For example, it is thus possible to monitor the state of the individual overvoltage protective modules M1, M2, M3. This data can be passed on for example from the head module K, K1 via a remote notification arrangement OUT.

It is furthermore possible for a fault of the overvoltage protective module M1, M2, M3 to also occur indirectly via the base element, for example if the previously described closer function is cancelled and the same fault as an unplugged overvoltage protective module is thus effectively signalled.

The presented invention makes it possible to provide in a particularly cost-effective manner a bus-oriented monitoring system for overvoltage protective modules, said monitoring system requiring merely a small amount of space, placing hardly any demands on mechanical tolerances, being insensitive to external interfering influences, such as impact, vibration, deposits and oxidation, and additionally also being able to transport further data.

Figure 7:
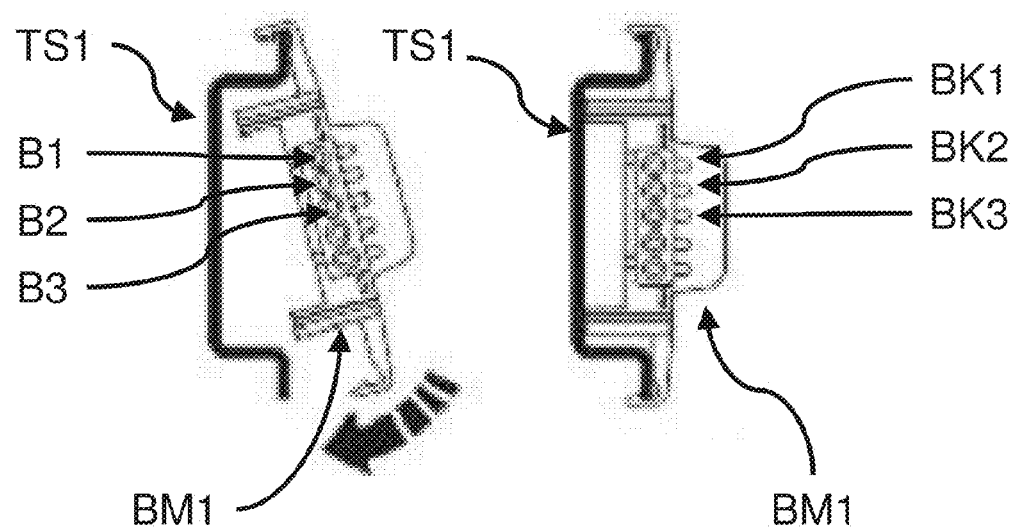
FIG. 7 shows a schematic sectional illustration of a bus module and of a mounting rail for use in a preferred embodiment of the invention.

A schematic sectional illustration of a bus module and of a mounting rail for use in a preferred embodiment of the invention is shown in FIG. 7.

Here, a first bus module BM1 is fitted onto a mounting rail TS, for example is clipped onto the mounting rail, as illustrated in the sequence shown in FIG. 7.

Here, the bus module BM1 is designed such that the first bus potential L1, the second bus potential L2, and the signal bus L3 and/or further signals can be guided in a manner framed by the recess in the mounting rail TS. Due to the modular design, it is possible on the one hand to achieve low manufacturing costs, and on the other hand the wiring complexity can be minimised, since only the bus modules BM1, BM2 are now to be fitted. In particular for a plurality of overvoltage protective arrangements, a remote enquiry can thus be implemented cost-effectively. The electronic monitoring arrangements UE1 can be connected via the first and the second bus potential L1, L2 to a power supply. The monitoring arrangements UE1 can easily signal a fault via the signal bus L3 as described before. The wiring complexity is low since the bus potentials L1, L2 and the signal bus L3 are guided in a manner framed by the recess in the mounting rail TS, whereby the connection can be easily produced. At the same time, the reliability is increased since the wiring always shows a fault source.

Here, the bus modules BM1, BM2 are designed such that they provide the contact of the first bus potential L1, of the second bus potential L2, and of the signal bus L3 to the base elements ST1, ST2, ST3 via the first bus connection arrangement BK1 for contacting the first bus potential L1, the second bus connection arrangement BK2 for contacting the second bus potential L2, and the third bus connection arrangement BK3 for contacting the signal bus L3.

To this end, a bus module BM1, BM2 has bus connection arrangements BK1, BK2, BK3, which are designed such that they can provide the respective bus potentials L1, L2, L3 to a plugged-on head module K, K1 or a plugged-on base element ST1, ST2, ST3.

The bus modules BM1, BM2 are preferably component parts of a system bus.

Furthermore, the head module K, K1 can also be designed such that it can be clipped onto a mounting rail TS.

Here, the head module K, K1 is designed such that it provides the contact of the first bus potential L1, of the second bus potential L2, and of the signal bus L3 to the base elements ST1, ST2, ST3 via a first bus connection arrangement BK1 for contacting the first bus potential L1, a second bus connection arrangement BK2 for contacting the second bus potential L2, and a third bus connection arrangement BK3 for contacting the signal bus L3.

The bus module is furthermore designed such that it still allows a clipped attachment of a head module K and a clipped attachment of a base element ST1, ST2, ST3 on the mounting rail TS.

Figure 8:
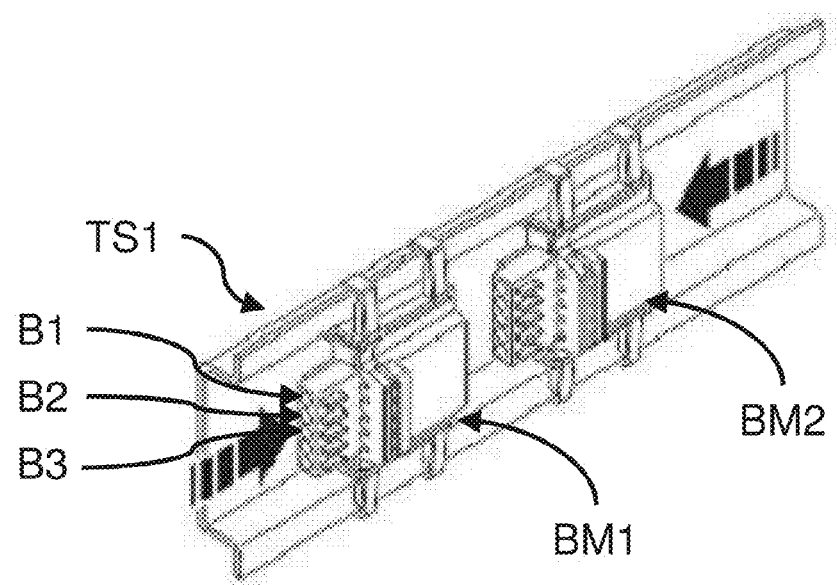
FIG. 8 shows a schematic perspective illustration of bus modules and of a mounting rail for use in a preferred embodiment of the invention.

As illustrated in FIG. 7 and FIG. 8, a bus module BM1, at least on one side in the plane of the mounting rail TS, has contacts B1, B2, B3 for contacting the bus potentials of an adjacent bus module BM2. It is particularly advantageous if the bus modules BM1, BM2, on the side in the plane of the mounting rail TS, have socket-like mounts B1, B2, B3, which can be brought into connection with pin-like mounts of a second bus module BM2.

A cost-effective system bus that can be easily assembled can clearly be provided by this plug-socket system.

Figure 9:
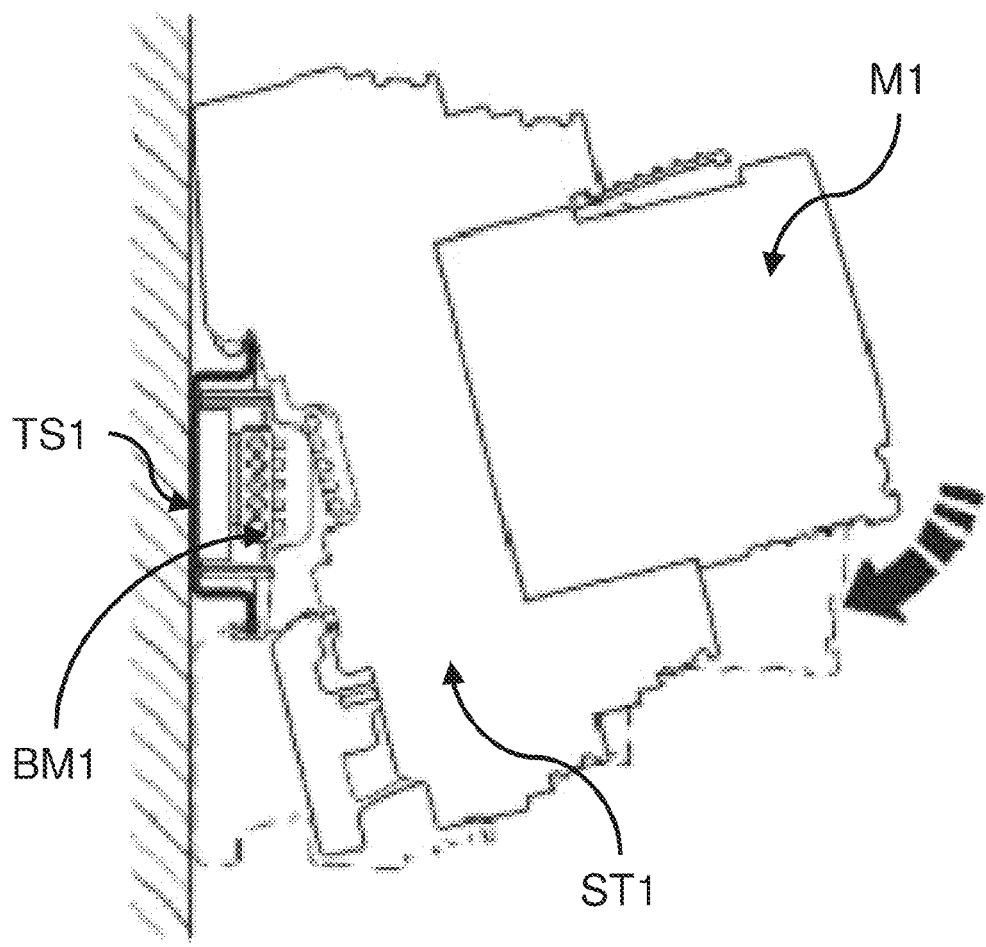
FIG. 9 shows a schematic sectional illustration of a bus module and of a mounting rail in use with an overvoltage protective module and a base element in accordance with a preferred embodiment of the invention.

In the event of assembly, a bus module BM1 is first clipped onto a mounting rail TS1, TS2, as illustrated in FIG. 7. A further bus module BM2 can then be attached adjacently hereto in a similar manner. These can then be brought into contact with one another by being slid together over the mounting rail TS1, TS2, as illustrated in FIG. 8, whereby the bus is provided. A base element ST1, in which an overvoltage protective module M1 can in turn be received, can be attached to a bus module BM1, as illustrated in FIG. 9. Alternatively to the base element ST1, a head module K, K1 may also be attached.

Figure 10:
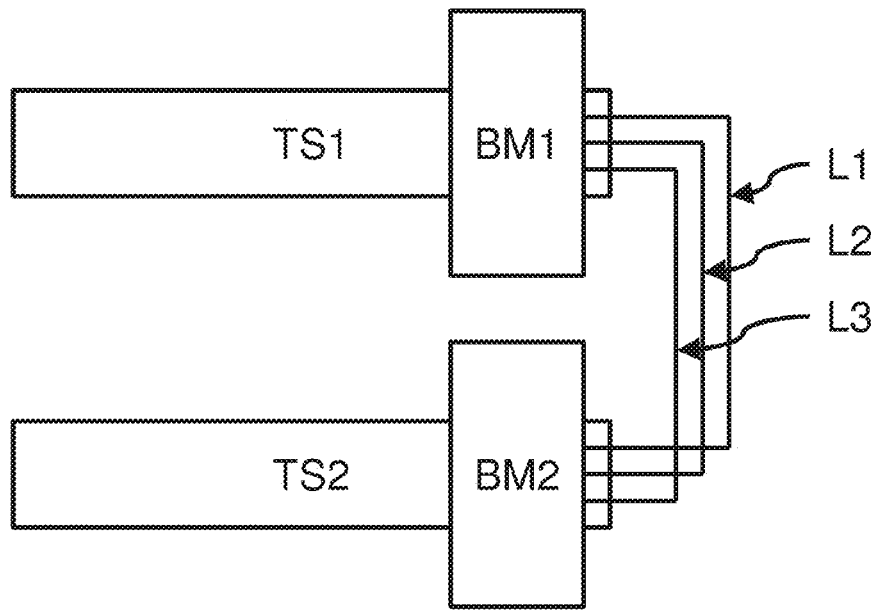
FIG. 10 shows a schematic illustration of different bus extensions across mounting rails in accordance with a preferred embodiment of the invention.
Figure 10:
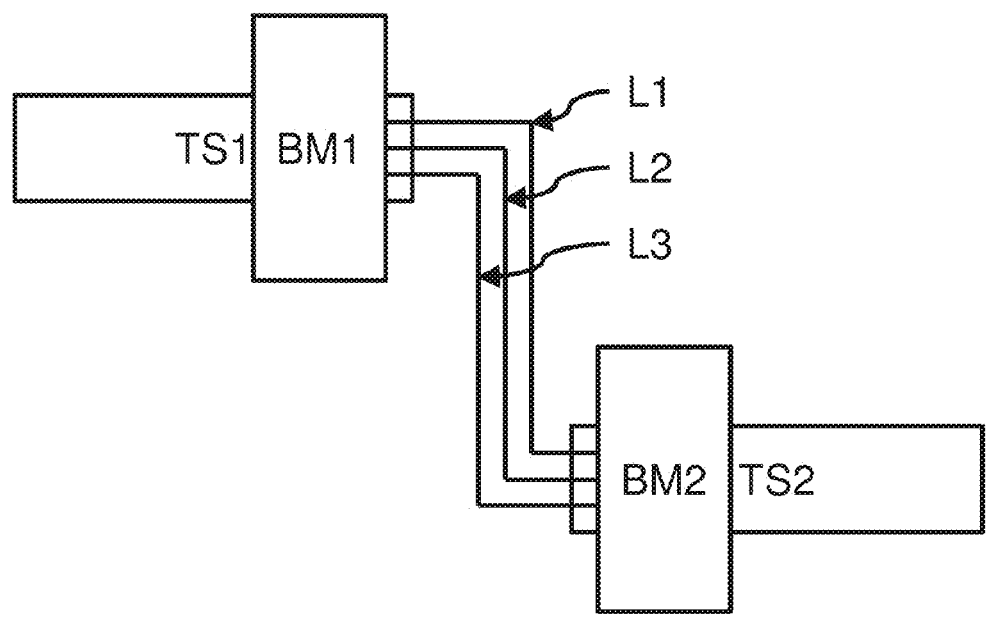

The bus system may also extend over a plurality of mounting rails TS1, TS2, as shown in FIG. 10. Here, a first bus module BM1, which is located on a first mounting rail TS1, can be connected by means of a cable having suitable plug connectors to a second bus module BM2, which is located on a second mounting rail TS2. Due to a suitable embodiment of the plug connectors, bus modules with socket-like mounts B1, B2, B3 on one side and bus modules having corresponding pin-like mounts on the other side can be connected. On the other hand, identical plug connectors may also be provided, for example socket-like mounts on both sides.

Figure 11:
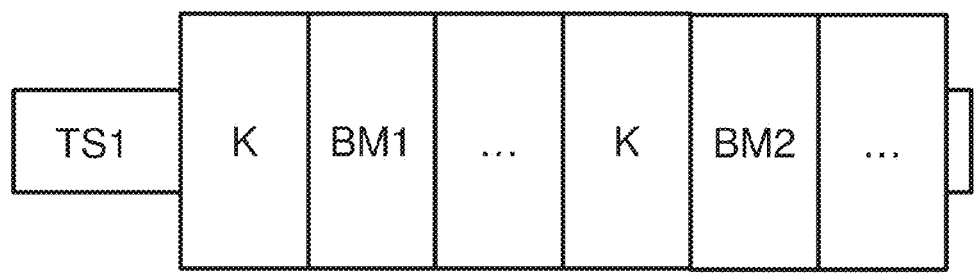
FIG. 11 shows a schematic illustration of a design comprising two head modules in accordance with a preferred embodiment of the invention.

Furthermore, if the power of a head module K is insufficient, a further head module K1 which provides the electrical power for further modules could also be used, as shown in FIG. 11. Here, the embodiment of the bus system causes a fault of an overvoltage protective module M2, which is connected by means of a bus module BM2 and which is located logically after the second head module K1, to be displayed by both head modules K, K1 as a fault. Conversely, a fault of an overvoltage protective module M1, which is connected by means of a bus module BM1 and which is located logically after the first head station K and before the second head module K1, is also indicated by both head modules K, K1 as a fault. In other words, the bus can thus be extended by a number of further modules. Furthermore, it is of course possible to use more than two head modules.

If many overvoltage protective arrangements are then required, the state enquiry can be implemented by a remote enquiry without the need for an additional wiring effort. The solution is therefore cost-effective and additionally advantageous since the bus system minimises the risk of detached wiring.

A faulty overvoltage protective module M1, M2, M3 can additionally report its state to the head station via the signal bus. Here, the reported state may include, for example, purely a faulty or non-faulty display of the overvoltage protective module, or may contain further classifications, for example a display of damage requiring replacement in the near future. Of course, further data, such as the number of leaks occurred and duration thereof, etc., can also be transmitted here. Furthermore, a clear identification of the overvoltage protective module M1, M2, M3 may also be provided, such that the respective overvoltage protective module can be identified as the sender of the display or data. The display or transmission of the data to a head station K, K1 can be implemented here on the one hand via the signal bus L3, but on the other hand also over one of the supply lines L1, L2 (for example in 1-wire technology) and across a further bus line (not illustrated).

List of Reference Signs
base element ST1, ST2, ST3
overvoltage protective module M1, M2, M3
first bus connection arrangement BK1, BK1'
second bus connection arrangement BK2, BK2'
third bus connection arrangement BK3, BK3'
electronic monitoring arrangement UE1
head module K, K1
resistor R1, R2, R3, R4
transistor T1, T2
optical signalling arrangement LED
acoustic signalling arrangement SPK
first bus potential, line L1
second bus potential, line L2
signal bus, line L3
mounting rail TS1, TS2
bus module BM1, BM2
contacts B1, B2, B3
remote notification arrangement OUT

The invention claimed is:

1. A base element for receiving an overvoltage protective module for use in a bus system, having
a first bus connection arrangement for contacting a first bus potential,
a second bus connection arrangement for contacting a second bus potential,
a third bus connection arrangement for contacting a signal bus, wherein the signal bus in a first state indicates the occurrence of a fault and in a second state indicates the non-occurrence of a fault,
wherein a fault indicates a missing or incorrectly received or faulty overvoltage protective module,
wherein the first and second bus potential are to be used to supply arrangements on the overvoltage protective module,
wherein the base element further comprises an electronic monitoring arrangement, wherein the electronic monitoring arrangement identifies whether an overvoltage protective module is received,
wherein:
if an overvoltage protective module is received in the base element, the second state is signalled via the signal bus, and,
if no overvoltage protective module is received in the base element or if the overvoltage protective module is received incorrectly or if the overvoltage protective module is faulty, the state of the signal bus remains unchanged.

2. The base element according to claim 1, wherein the base elements can be clipped onto a mounting rail, and the first bus potential, the second bus potential, and the signal bus are guided in a recess in the mounting rail.

3. The base element according to claim 1, wherein the electronic monitoring arrangement has a semiconductor switch.

4. The base element according to claim 1, wherein the electronic monitoring arrangement is an opener, wherein, in the event of a correctly received overvoltage protective module, the switch is opened.

5. The base element according claim 1, wherein the electronic monitoring arrangement has a transistor.

6. The base element according to claim 1, wherein the electronic monitoring arrangement has an FET and/or a bipolar transistor.

7. The base element according to claim 1, further comprising a local signalling arrangement for signalling to the optical and/or acoustic display whether an overvoltage protective module is correctly received.

8. The base element according to claim 1, wherein the bus potentials are provided via a system bus.

9. A modular bus system comprising:
one or more base elements for receiving an overvoltage protective module according to one of the preceding claims, and
a head module having:
a first bus connection arrangement for contacting a first bus potential,
a second bus connection arrangement for contacting a second bus potential,
a third bus connection arrangement for contacting a signal bus, wherein the signal bus in a first state indicates the occurrence of a fault and in a second state indicates the non-occurrence of a fault, and
a signalling arrangement which indicates whether a fault has been signalled over the signal bus, wherein the head module can be clipped onto a mounting rail and the first bus potential, the second bus potential and the signal bus are guided in a recess in the mounting rail.

10. The modular bus system according to claim 9, wherein the head module further comprises a remote notification arrangement, which can pass on notification of an identified fault.

11. The modular bus system according to claim 9, wherein the head module provides via the first and second bus connection arrangement a first and a second bus potential for supplying the base elements.

12. The modular bus system according to claim 9, wherein the bus potentials are provided via a system bus.

13. The modular bus system according to claim 12, wherein the system bus has one or more bus modules, wherein a bus module can be clipped onto a mounting rail, and a bus module has bus connection arrangements that are designed such that they provide the respective bus potentials to a plugged-on head module or to a plugged-on base element.

14. The modular bus system according to claim 12, wherein the bus module, at least on one side in the plane of the mounting rail, provides contacts for contacting the bus potentials of an adjacent bus module.

15. The modular bus system according to claim 12, wherein at least some of the bus connection arrangements are designed such that they have one or more socket-like mounts, which can be brought into connection with pin-like mounts.

16. The modular bus system according to claim 12, wherein at least some of the bus connection arrangements are designed such that they have one or more pin-like mounts, which can be brought into connection with socket-like mounts.

17. The modular bus system according to claim 12, wherein the system bus has two or more head modules.

18. The modular bus system according to claim 12, wherein the system bus extends over two or more mounting rails.

19. The modular bus system according to claim 10, wherein the head module provides via the first and second bus connection arrangement a first and a second bus potential for supplying the base elements.

20. The base element according to claim 2, wherein the electronic monitoring arrangement has a semiconductor switch.

* * * * *